(12) United States Patent
Shiina et al.

(10) Patent No.: US 8,833,299 B2
(45) Date of Patent: Sep. 16, 2014

(54) DIVIDED ANNULAR RIB TYPE PLASMA PROCESSING APPARATUS

(75) Inventors: Yuichi Shiina, Tokyo (JP); Iwao Watanabe, Tokyo (JP)

(73) Assignee: Ferrotec Corporation, Tokyo (JP)

( * ) Notice: Subject to any disclaimer, the term of this patent is extended or adjusted under 35 U.S.C. 154(b) by 422 days.

(21) Appl. No.: 13/265,316

(22) PCT Filed: Jun. 30, 2010

(86) PCT No.: PCT/JP2010/061193
§ 371 (c)(1),
(2), (4) Date: Oct. 19, 2011

(87) PCT Pub. No.: WO2011/002036
PCT Pub. Date: Jan. 6, 2011

(65) Prior Publication Data
US 2012/0031337 A1 Feb. 9, 2012

(30) Foreign Application Priority Data
Jul. 1, 2009 (JP) .................. 2009-157103

(51) Int. Cl.
| | |
|---|---|
| C23C 16/50 | (2006.01) |
| C23C 16/505 | (2006.01) |
| C23C 16/509 | (2006.01) |
| C23C 16/455 | (2006.01) |
| C23F 1/00 | (2006.01) |
| H01L 21/306 | (2006.01) |
| C23C 14/32 | (2006.01) |
| H01J 37/32 | (2006.01) |
| C23C 14/56 | (2006.01) |
| C23C 16/06 | (2006.01) |
| C23C 16/22 | (2006.01) |

(52) U.S. Cl.
CPC ............. *C23C 14/564* (2013.01); *C23C 14/325* (2013.01); *H01J 37/32357* (2013.01); *H01J 37/32477* (2013.01)
USPC .............. 118/723 E; 118/723 R; 156/345.43; 156/345.45

(58) Field of Classification Search
USPC .......... 118/723 E, 723 R; 156/345.43, 345.45
See application file for complete search history.

(56) References Cited

U.S. PATENT DOCUMENTS 4,633,809 A * 1/1987 Hirose et al. .................. 118/719
4,767,641 A * 8/1988 Kieser et al. .................. 427/569
(Continued)

FOREIGN PATENT DOCUMENTS

JP H10-505633 A 6/1998
JP H10-280135 A 10/1998
(Continued)

*Primary Examiner* — Rudy Zervigon
(74) *Attorney, Agent, or Firm* — DLA Piper LLP (US)

(57) ABSTRACT

A plasma stream-derived deposited matter formed on an annular rib for droplet capture in a plasma processing apparatus is prevented from falling into a plasma generation portion and causing a short circuit. The annular rib for the droplet capture is divided into multiple rib segments. Thus, from the beginning of the formation of the deposited matter on the annular rib due to the aggregation of the material in the plasma stream, it is possible to reduce the size of the deposited matter. By reducing the size of this deposited matter, when a piece of the deposited matter falls into the plasma generation portion, the piece of the deposited matter gets into a groove portion provided between a cathode and a wall surface of the plasma generation portion, thereby preventing the electrical short circuit between the cathode and the wall surface.

14 Claims, 20 Drawing Sheets

(56) References Cited

U.S. PATENT DOCUMENTS

| | | | |
|---|---|---|---|
| 4,954,201 A * | 9/1990 | Latz et al. | 156/345.43 |
| 5,192,370 A * | 3/1993 | Oda et al. | 118/723 R |
| 5,279,723 A | 1/1994 | Falabella et al. | |
| 5,647,912 A * | 7/1997 | Kaminishizono et al. | 118/719 |
| 5,879,523 A * | 3/1999 | Wang et al. | 204/298.11 |
| 5,945,354 A * | 8/1999 | Mautz | 438/731 |
| 6,022,461 A * | 2/2000 | Kobayashi et al. | 204/298.07 |
| 6,221,202 B1 * | 4/2001 | Walko, II | 156/345.43 |
| 6,277,237 B1 * | 8/2001 | Schoepp et al. | 156/345.1 |
| 6,296,747 B1 * | 10/2001 | Tanaka | 204/298.07 |
| 6,475,353 B1 * | 11/2002 | Lantsman | 204/192.12 |
| 6,645,357 B2 * | 11/2003 | Powell | 204/298.11 |
| 6,730,174 B2 * | 5/2004 | Liu et al. | 118/715 |
| 6,846,396 B2 * | 1/2005 | Perrin | 204/298.11 |
| 6,890,596 B2 * | 5/2005 | Sarigiannis et al. | 427/248.1 |
| 7,001,491 B2 * | 2/2006 | Lombardi et al. | 204/192.12 |
| 7,048,837 B2 * | 5/2006 | Somekh et al. | 204/192.13 |
| 7,182,816 B2 * | 2/2007 | Kleshock et al. | 118/715 |
| 7,229,666 B2 * | 6/2007 | Mardian et al. | 427/248.1 |
| 7,468,104 B2 * | 12/2008 | Mardian et al. | 118/715 |
| 7,498,057 B2 * | 3/2009 | Sarigiannis et al. | 427/248.1 |
| 7,811,428 B2 * | 10/2010 | Nishimoto et al. | 204/298.11 |
| 8,118,938 B2 * | 2/2012 | Carducci et al. | 118/715 |
| 8,440,019 B2 * | 5/2013 | Carducci et al. | 118/715 |
| 8,480,850 B2 * | 7/2013 | Tyler et al. | 156/345.47 |
| 8,540,844 B2 * | 9/2013 | Hudson et al. | 156/345.43 |
| 2003/0168168 A1 * | 9/2003 | Liu et al. | 156/345.3 |
| 2004/0216998 A1 * | 11/2004 | Fu | 204/298.11 |
| 2005/0039679 A1 * | 2/2005 | Kleshock et al. | 118/715 |
| 2005/0167052 A1 * | 8/2005 | Ishihara et al. | 156/345.47 |
| 2007/0204794 A1 * | 9/2007 | Nishimoto et al. | 118/506 |
| 2007/0234959 A1 * | 10/2007 | Nakanishi et al. | 118/720 |
| 2008/0156657 A1 * | 7/2008 | Butterfield et al. | 205/662 |
| 2008/0257263 A1 * | 10/2008 | Pavloff et al. | 118/723 R |
| 2009/0028761 A1 * | 1/2009 | Devine et al. | 422/186.04 |
| 2009/0188625 A1 * | 7/2009 | Carducci et al. | 156/345.34 |
| 2009/0206521 A1 * | 8/2009 | Begovic | 264/442 |
| 2009/0236043 A1 * | 9/2009 | Matsudo et al. | 156/345.43 |
| 2009/0250169 A1 * | 10/2009 | Carducci et al. | 156/345.34 |
| 2009/0311145 A1 * | 12/2009 | Wu et al. | 422/129 |
| 2011/0042009 A1 * | 2/2011 | Lee et al. | 156/345.43 |
| 2012/0000424 A1 * | 1/2012 | Inagawa | 118/723 R |
| 2012/0031337 A1 * | 2/2012 | Shiina et al. | 118/723 R |

FOREIGN PATENT DOCUMENTS

| | | |
|---|---|---|
| JP | 2006-274280 A | 10/2006 |
| JP | 2008-091184 A | 4/2008 |
| JP | 2008-248347 A | 10/2008 |

* cited by examiner

140

141

142

DIVIDED ANNULAR RIB TYPE PLASMA PROCESSING APPARATUS

FIELD OF THE INVENTION

The present invention concerns a plasma processing apparatus processing an object to be treated by a plasma generated by an arc-discharge in a plasma generating portion under vacuum environment, and more specifically, it concerns a plasma processing apparatus equipped with a droplet removing portion that removes cathode material particles produced as a byproduct from a cathode at the time of the vacuum arc discharge (subsequently referred to as "droplets").

BACKGROUND ART

By doing a plasma treatment in which a material is made into plasma and then deposited on an object to be treated, a strong film can be formed on said object to be treated. In particular, when carbon is used as said material, a diamond-like carbon (DLC) film comprising an amorphous conglomerate of the diamond structure and the graphite structure can be obtained on the object to be treated. This DLC film has good mechanical, chemical, and optical properties.

As a method to make said material into plasma, there is a method in which said material is made into a cathode, and plasma is formed from said cathode by generating an arc discharge under vacuum between it and the trigger electrode that is an anode. The plasma formed this way is led from the plasma generating portion to a plasma advancing tube as a plasma stream in the plasma processing apparatus, introduced into the plasma processing portion, and used for the film treatment of the object to be treated.

In this arc discharge, at the same time as the plasma generation, cathode material particles called droplets, ranging in size from less than submicron up to several hundred microns, are also produced as a byproduct. When these droplets arrive at said plasma processing portion and adhere to the object to be treated, defects occur on the film of said object to be treated. Therefore, a means for removing these droplets is necessary to maintain the quality of said film.

As a droplets capture means, an annular rib placed in a plasma advancing tube is disclosed in the Japanese Patent Laid-Open No. 2008-91184 bulletin (Patent Document 1) and the Japanese Patent Laid-Open No. 2008-248347 bulletin (Patent Document 2).

FIG. 19 is a perspective diagram of this annular rib 140. Annular rib 140 has plasma advancing tube joining portion 141 and rib portion 142, and annular rib 140 is positioned by joining plasma advancing tube joining portion 141 with plasma advancing tube. The droplets generated in the plasma generating portion collide with rib 142, and are captured. On the other hand, the plasma stream passes through the open portion in the center of annular rib 140, and advances to the plasma processing portion.

Usually, rib 142 is inclined toward the upstream direction of said plasma stream in comparison to the central axis of said plasma advancing tube, and the efficiency of the capture of said droplets is improved by this inclination.

Said droplets are deposited on said annular rib. This deposited matter is extremely fragile, because the binding power between the constituent droplets is weak. Therefore, even if it falls from said annular rib, because it is crushed by the shock at the time of the fall, it does not remain in the plasma generating portion as a large-sized fragment.

It has been confirmed that this annular rib 140 contributes highly to the removal of droplets, and the plasma processing apparatus equipped with annular rib 140 has gained an industrial success.

[Patent Document 1] Japanese Patent Laid-Open No. 2008-91184 bulletin

[Patent Document 2] Japanese Patent Laid-Open No. 2008-248347 bulletin

DISCLOSURE OF THE INVENTION

Problems to be Solved by the Invention

However, this annular rib has a characteristic that should be improved. That is to say, the material in the plasma stream aggregates on this annular rib, forming a deposited matter. This deposited matter falls into the plasma generating portion, and causes a short circuit in the plasma generating portion.

Said annular rib is not only exposed to droplets, but also exposed to plasma stream. The material of this plasma stream aggregates on this annular rib, and a deposited matter is formed. Because this deposited matter is formed by recrystallization of the material in plasma state, there is very little grain boundary that causes fragility. Because of this, this deposited matter has a high strength, and therefore, when it falls from said annular rib, it is likely to turn into a large fragment.

FIG. 20 is a transparent schematic diagram showing a causation of short circuit by deposited matter fragment 191 in conventional plasma processing apparatus 101. In plasma generating portion 110 of this plasma processing apparatus 101, a positive electrical voltage is applied to trigger electrode 112, and a negative electrical voltage is applied to cathode 111. A vacuum arc discharge is generated between trigger electrode 112 and cathode 111, and the material that constitutes cathode 111 becomes plasma. This plasma is conducted to tube 130 as a plasma stream, conducted to horizontal plasma advancing tube 160 through bent portion 150, and conducted furthermore to the plasma processing portion in which the object to be treated has been placed.

At the time of the vacuum arc discharge, droplets are produced as a byproduct simultaneously with the generation of said plasma, but these droplets are captured by annular rib 140. Because this annular rib 140 is exposed to said plasma stream, the material of this plasma stream aggregates on annular rib 140, and deposited matter 190 is formed, as shown in (20A). A large-sized fragment 191 of this deposited matter 190 falls into plasma generating portion 110, as shown in (20B).

Wall surface 113 of plasma generating portion 110 is in conductive state with trigger electrode 112. Therefore, a positive electrical voltage is applied also to wall surface 113. Because of this, if wall surface 113 and cathode 111 are bridged by said deposited matter, a short circuit is caused. In the worst case, an electric damage of plasma processing apparatus 101 is caused by this short circuit. Even if said damage is not caused, a large quantity of droplets are generated by a sudden decomposition due to the heating of large-sized fragment 191, and the plasma treatment of the object to be treated becomes uneven. Groove portion 114 is installed between cathode 111 and wall surface 113, and the material that has entered this groove portion 114 does not short-circuit cathode 111 and wall surface 113. However, if the size of fragment 191 of said deposited matter is such that it cannot fit into groove portion 113, said short circuit is caused.

Means to Solve the Problems

The present invention was done to solve the above problem. In the present invention, by dividing an annular rib for droplets capture into multiple rib segments, a size reduction is achieved from the beginning of the formation of the deposited matter forming on said annular rib by aggregation of the material in the plasma stream. By the size reduction of this deposited matter, when this deposited matter falls into the plasma generating portion as a fragment, this fragment enters the groove portion installed between the cathode and the wall surface of said plasma generating portion, thus preventing an electric short circuit between said cathode and said wall surface.

Therefore, the first form of the present invention is, in a plasma processing apparatus transporting a plasma generated in a plasma generating portion by an electric discharge to a plasma processing portion through a plasma advancing tube in which multiple annular ribs for droplet capture are arranged on an inside surface, a divided annular rib type plasma processing apparatus, characterized in that a first annular rib exposed to said plasma that is the furthest advanced among said annular ribs is comprised of at least a multiply divided annular rib divided into multiple rib segments by interposing multiple indentations.

The second form of the present invention is the divided annular rib type plasma processing apparatus of the first form, wherein a second annular rib that is positioned at a further downstream side of said plasma stream than first annular rib in a neighboring fashion is comprised of said multiply divided annular ribs, and said second annular rib is positioned to shield all said indentations of said first annular rib by rib segments of said second annular rib.

The third form of the present invention is the divided annular rib type plasma processing apparatus of the second form, wherein among multiple annular ribs that are placed at a further downstream side of said plasma stream than said second annular rib, an annular rib placed at a position in which it is easily exposed to said plasma is comprised of said multiply divided annular rib.

The fourth form of the present invention is the divided annular rib type plasma processing apparatus of the second form, wherein all annular ribs placed at a plasma stream downstream side of said second annular rib are comprised of said multiply divided annular ribs.

The fifth form of the present invention is the divided annular rib type plasma processing apparatus of any one of the second to fourth forms, wherein a spacing between said first annular rib and said second annular rib can be adjusted freely to be wider or narrower than a mutual spacing between other annular ribs.

The sixth form of the present invention is the divided annular rib type plasma processing apparatus of any one of the second to fifth forms, wherein at least two of said multiply divided annular ribs have different configurations.

The seventh form of the present invention is the divided annular rib type plasma processing apparatus of any one of the first to sixth forms, wherein said indentations are formed so that they span the full width of said multiply divided annular rib.

The eighth form of the present invention is the divided annular rib type plasma processing apparatus of any one of the first to sixth forms, wherein said indentations are formed so that they span a partial width of said multiply divided annular rib from the inside of said multiply divided annular rib.

The ninth form of the present invention is the divided annular rib type plasma processing apparatus of any one of the first to eighth forms, wherein said multiply divided annular rib inclines downward from outside to inside.

The tenth form of the present invention is the divided annular rib type plasma processing apparatus of any one of the first to eighth forms, wherein said multiply divided annular rib is perpendicular to a central axis of said plasma advancing tube.

The eleventh form of the present invention is the divided annular rib type plasma processing apparatus of any one of the first to eighth forms, wherein areas, shapes, and/or angles of inclination of said rib segments and/or said indentations in said multiply divided annular rib are nonuniform.

The twelfth form of the present invention is the divided annular rib type plasma processing apparatus of any one of the first to eleventh forms, wherein an inner circumferential tube is placed inside said plasma advancing tube, and said multiply divided annular rib portion is placed inside said inner circumferential tube.

The thirteenth form of the present invention is the divided annular rib type plasma processing apparatus of the twelfth form, wherein an insulation portion is interposed between said plasma advancing tube and said inner circumferential tube, while said plasma advancing tube and said inner circumferential tube are made to be mutually independent electrically.

The fourteenth form of the present invention is the divided annular rib type plasma processing apparatus of any one of the first to thirteenth forms, wherein a starting end insulation ring is interposed between said plasma generating portion and said plasma advancing tube, while said plasma generating portion and said plasma advancing tube are made to be mutually independent electrically.

The fifteenth form of the present invention is the divided annular rib type plasma processing apparatus of any one of the first to fourteenth forms, wherein said plasma processing portion that processes an object to be treated by a plasma supplied from said plasma advancing tube and said plasma advancing tube are made to be mutually independent electrically, by interposing a finishing end insulation plate between said plasma processing portion and said plasma advancing tube.

The sixteenth form of the present invention is the divided annular rib type plasma processing apparatus of any one of the first to fifteenth forms, wherein said divided annular rib type plasma processing apparatus is comprised of said cathode arranged at an electric discharge position of said plasma generating portion, a cathode for exchange placed at a standby position separated from said electric discharge position, a cathode polishing portion that polishes a surface of said, cathode for exchange, and a cathode exchange mechanism that exchanges said cathode with said cathode for exchange.

Effects of the Invention

According to the first form of the present invention, the annular rib exposed to the plasma stream is divided into multiple rib segments by multiple indentations. Because of this, when the material of said plasma stream is deposited on the tip end of said annular rib, the formed deposited matter does not become larger than said rib segment. Therefore, even if said deposited matter detaches and falls from said rib segment, because it enters into the groove portion between the cathode and the wall surface of the plasma generating portion, a short circuit is not generated between said cathode and said wall surface.

When said annular ribs are multiply placed, the deposited matter formation on the annular ribs by a plasma stream becomes large on annular ribs placed upstream of the plasma stream, and becomes small on annular ribs placed downstream. Therefore, a sufficient size reduction effect of the deposited matter is provided, by making only the first annular rib placed most upstream of the plasma stream into a multiply divided annular rib.

In a multiply divided annular rib of the present invention, to increase the droplets capture area, a surface roughening process may be done, in which innumerable unevenness is formed on the surface. Also, to increase the efficiency of droplets capture, the multiply divided annular rib may be slanted downward toward the central axis of the plasma advancing tube.

In a multiply divided annular rib of the present invention, it is not necessary that the area, the angles of inclination and such of the multiple indentations and the multiple rib segments formed by said indentations are uniform over the entire rib. For example, when the concentration of droplets in the plasma advancing tube is nonuniform in the vertical cross section of plasma stream, the droplets capture efficiency can be increased by optimizing the inclination angles and the areas among others of said multiple rib segments for those rib segments exposed to droplets of high concentration.

The number of sufficient rib segments in a multiply divided annular rib of the present invention is a minimum of 2, and a maximum of infinite. However, to achieve a size reduction of deposited matter, it is more advantageous that the number of rib segments is large, and the preferred minimum is 6. Also, the practical maximum of rib segments is determined by the feasibility and ease of construction, and the preferred maximum is about 100.

According to the second form of the present invention, because all indentations of the first annular rib is shielded by the rib segments of the second annular rib, droplets that have passed through the indentations of the first annular rib can be captured by the rib segments of the second annular rib. Therefore, the droplets capture effect is improved. Also, by making the second annular rib into a multiply divided annular rib of the present invention, the size reduction of deposited matter fragment is made more complete.

According to the third form of the present invention, because the multiply divided annular rib of the present invention is placed at a further downstream side of the plasma stream compared to said second annular rib, the size reduction of the deposited matter is made even more complete. Also, a decrease can be achieved for the percentage of droplets that pass though the indentations of many multiply divided annular ribs and reach the plasma processing portion.

"The position which it is easily exposed" in here usually signifies a single or multiple annular ribs placed next to the second annular rib at the downstream side. However, when the plasma stream becomes high in concentration at a position distant from the first ant the second annular rib due to the design of the plasma processing apparatus, that position becomes "the position which it is easily exposed" in here.

According to the fourth form of the present invention, because all annular ribs are made to be said multiply divided annular ribs, the size reduction of said deposited matter fragments can be achieved to full limit. Also, a decrease can be achieved of the percentage of the droplets that pass through the indentations of many multiply divided annular ribs and reach the plasma processing portion.

According to the fifth form of the present invention, because the spacing between said first annular rib and said second annular rib can be freely adjusted to be long or short lengthwise, the spacing can be adjusted to optimize the capture efficiency of droplets and the ease of construction. If the spacing is shortened, the capture efficiency of droplets can be increased, because the possibility decreases that the curvedly advancing droplets pass both the indentations of the first annular rib and the indentations of the second annular rib. On the other hand, if the spacing is lengthened, the production of a plasma processing apparatus of the present invention becomes easier, because placing the first annular rib and the second annular rib becomes easier.

According to the sixth form of the present invention, among said multiply divided annular ribs that have been multiply placed, at least two have different configurations. Because of this, an appropriate configuration of multiply divided annular rib can be used, depending on the condition inside said plasma processing apparatus. For example, by leaving an undivided area on the second annular rib by making the indentations of the second annular rib shallower than the indentations of the first annular rib, droplets that pass through the indentations of the first annular rib and advance curvedly can be captured by said area of the second annular rib.

According to the seventh form of the present invention, because said indentations are formed so that they span the full width of said multiply divided annular rib, said rib segments are completely separated from one another, and the size reduction of deposited matter formed on said rib segment can be accomplished to perfection.

According to the eighth form of the present invention, because said indentations are formed so that they span a partial width of said multiply divided annular rib, a continual base end rib portion of said multiply divided annular rib is formed along the inner wall of said plasma advancing tube. Therefore, the size reduction of deposited matter on said rib segment can be achieved, and at the same time, a droplet capture function can be obtained.

As described in the explanation for FIGS. 2 and 3, droplets are easily captured at the outside of an annular rib. On the other hand, deposited matter from a plasma stream is easily formed at the inside of an annular rib. Therefore, by positioning a divided rib segment inside, and a continual base end rib portion outside, the size reduction of deposited matter and the capture of droplets can be achieved simultaneously. In the present form, 10%-90% is preferable as the ratio between the widths of the partial indentations and the annular rib, and even more preferable is 25%-75%.

According to the ninth form of the present invention, because said multiply divided annular rib slants downward, droplets are easily reflected continuously between said rib and the inner wall of said plasma advancing tube. The droplets are halted by this continuous reflection, and captured on a said rib. Therefore, the droplet capture becomes efficient. The angle of inclination used commonly is 15-90° with respect to the central axis of said plasma advancing tube. From experience, the optimum angle of inclination 30-60°.

According to the tenth form of the present invention, because said multiply divided annular rib is perpendicular with respect to the central axis of said plasma advancing tube, said annular rib becomes parallel to the ring plane of said annular rib. Because of this configuration, the production of said multiply divided rib portion becomes easy.

According to the eleventh form of the present invention, because the areas, the configuration, and/or the angles of inclination of said rib segments and/or said indentations are nonuniform, the configuration of the rib segments can be varied according to the necessity due to the deposited matter formation in each part of the plasma advancing tube or the droplets capture, whenever the plasma stream or the droplets concentration is uneven.

According to the twelfth form of the present invention, because an inner circumferential tube is formed, said multiply divided annular rib may be placed in said inner circumferential tube beforehand, and said inner circumferential tube can be fitted in said plasma advancing tube afterward. Therefore, a placement process of said multiply divided annular rib to said plasma advancing tube can be omitted, leading to a simplification of the production process of said plasma processing apparatus, and an obtaining of the strength of said plasma advancing tube.

According to the thirteenth form of the present invention, because an insulation portion is placed between said inner circumferential tube and said plasma advancing tube, the inside of said inner circumferential tube is put in an electrically floating state. Therefore, the control of the electric field in the inside of said inner circumferential tube becomes easy, and control of said plasma stream can be done carefully.

According to the fourteenth form of the present invention, because a starting end insulation ring is interposed between said plasma generating portion and said plasma advancing tube, an influence by the electric field from said plasma generating portion to said plasma advancing tube can be reduced. Therefore, the control of said plasma stream in said plasma advancing tube becomes easier.

According to the fifteenth form of the present invention, because a finishing end insulation plate is interposed between the plasma processing portion and said plasma advancing tube, an influence by the electric field from said plasma generating portion and said plasma advancing tube to said plasma processing portion can be reduced. When both a finishing end insulation plate of the present form and a starting end insulation plate of the 14th form are placed, because said plasma advancing tube becomes isolated electrically by the two insulation portions, the inside of said inner circumferential tube is put into an electrically floating state. Therefore, the control of the electric field in the inside of said inner circumferential tube becomes easy, and control of said plasma stream can be done carefully.

According to the sixteenth form of the present invention, because two cathodes are equipped, one being in an operational state, the remaining one being polished in a standby state, and they are exchanged by said cathode exchanging means, said cathodes can be exchanged while the vacuum inside said plasma processing apparatus is kept. Therefore, during the operation of said plasma processing apparatus, the cathode whose surface has been consumed by use can be exchanged for the cathode whose surface has been polished, and because of this, the film treatment of the object to be treated can be done with high efficiently. This exchanging means is easily damaged by a short circuit caused by said deposited matter fragment, and also the mechanism of this exchanging means is easily jammed by said fragment, but the multiply divided annular rib of the present invention can prevent such damage and jamming by reducing the size of said fragment.

DENOTATION OF REFERENCE NUMERALS

Figure 1:
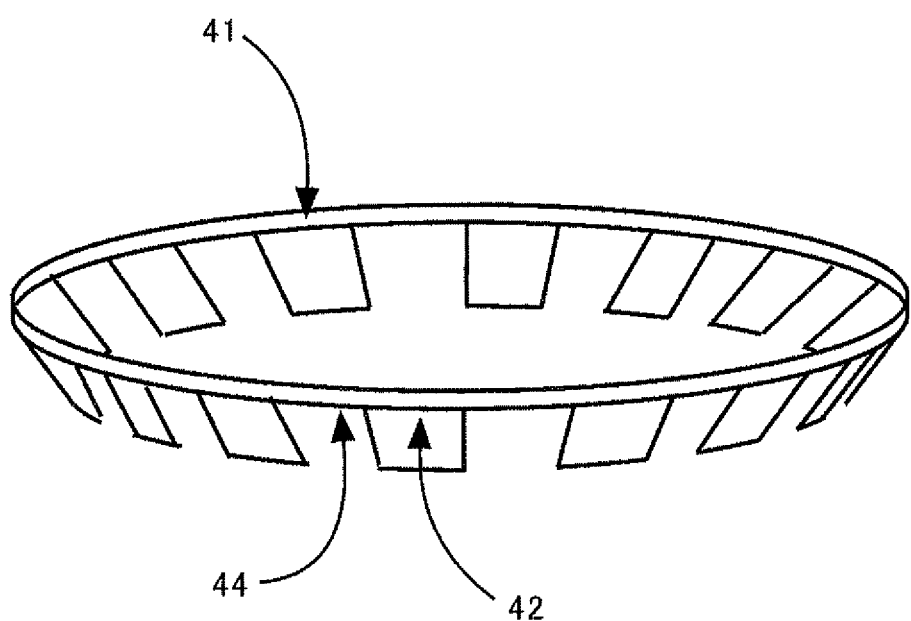
FIG. 1 is a perspective diagram of a multiply divided annular rib of the present invention.

1 Plasma processing apparatus
10 Plasma generating portion
11 Cathode
12 Trigger electrode
13 Wall surface of plasma generating portion
14 Groove portion
20 Starting end insulation ring 21 Plasma stream
22 Droplets.
30 Plasma advancing tube
31 Inner circumferential tube
32 Insulation portion
40 Multiply divided annular rib
40a First annular rib
40b Second annular rib
41 Plasma advancing tube joining portion
42 Rib segment
43 Base end rib portion
44 Indentation
45 Undivided rib portion
50 Bent portion
60 Plasma horizontally advancing tube
61 Finishing end section insulation plate
63 Plasma processing portion
80 Cathode exchange portion
81 Cathode for exchange
82 Motor
83 Cathode exchange platform
84 Cathode raising and lowering platform
85 Grinder
86 Motor for grinder
90 Deposited matter
91 Small-sized fragment of deposited matter
92 Droplets deposited matter
101 Conventional plasma processing apparatus
110 Plasma generating portion
111 Cathode
112 Trigger electrode
113 Wall surface of plasma generating portion
114 Groove portion
120 Insulation plate
130 Plasma advancing tube
140 Conventional annular rib
141 Plasma advancing tube joining portion
150 Bent portion
160 Plasma horizontally advancing tube
190 Deposited matter
191 Large-sized fragment of deposited matter

BEST MODE FOR CARRYING OUT THE INVENTION

Figure 3:
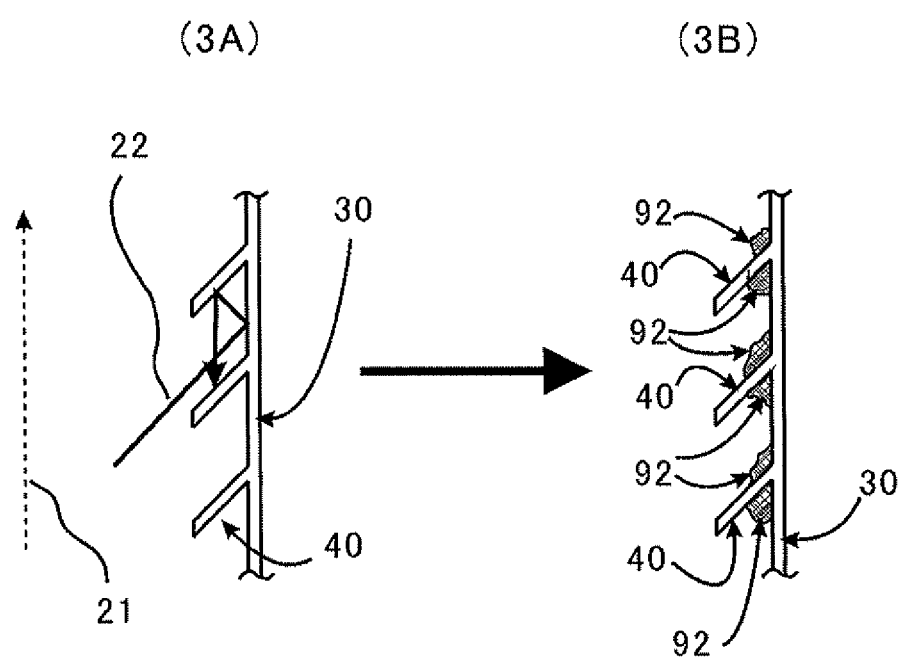
FIG. 3 is a conceptual diagram showing deposition of droplets on an annular rib.

In the following, an embodiment of the present invention is explained in detail by following the figures. FIG. 1 is a perspective diagram of multiply divided annular rib 40 of the present invention. In FIG. 1, this annular rib 40 is comprised of plasma advancing tube joining portion 41 and rib segments 42, and rib segments 42 are completely separated from one another by indentations 44. Because of this separation, the size of deposited matter deposited onto rib segment 42 does not become larger that the size of this rib segment 42. Rib segments 42 of annular rib 40 in FIG. 1 are slanted downward toward inside. This inclination, as described in the explanation for FIG. 3, is useful for capturing droplets by successive reflection.

The surface of rib segment 42 may be smooth, or unevenness may be provided onto it to increase the surface area. When such unevenness is provided, the droplet capture efficiency of rib segment 42 becomes greater than in a case that rib segment 42 is smooth. On the other hand, cleaning becomes easier when rib segment 42 is smooth.

Figure 2:
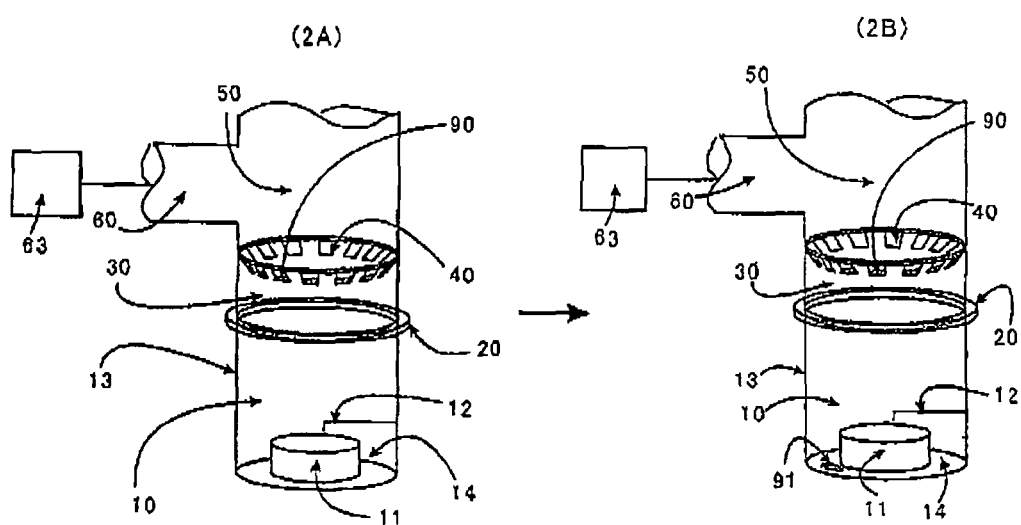
FIG. 2 is a schematic perspective diagram indicating a lack of influence by a fragment of deposited matter in the plasma processing apparatus of the present invention.

FIG. 2 is a schematic perspective diagram indicating a lack of influence by fragment 91 of deposited matter in plasma processing apparatus 1 of the present invention. In plasma processing apparatus 1, the material constituting cathode 11 is made into plasma by an arc discharge between trigger electrode 12 placed inside plasma generating portion 10 and cathode 11, and it is conducted to plasma advancing tube 30 as a plasma stream. Furthermore, this plasma stream is conducted to plasma horizontally advancing tube 60 through bent portion 50, reaches a plasma processing portion 63 set up at the finishing end portion of plasma horizontally advancing tube 60, and it is used to plasma-treat the object to be treated placed in said plasma processing portion 63. At the time of arc discharge, droplets are produced at the same time as the plasma as a byproduct. These droplets are scattered, and are captured by multiply divided annular rib 40 placed in plasma advancing tube 30.

Annular rib 40 is exposed to said plasma stream, and as shown in (2A), a part of the plasma stream material aggregates on rib segment 42 of annular rib 40, forming deposited matter 90. However, as described in the explanation for FIG. 1, the size of deposited matter 90 does not become larger than the size of rib segment 42. Therefore, as shown in (2B), even if deposited matter 90 falls as fragment 91 into plasma generating portion 10, fragment 91 enters into groove portion 14, and therefore do not cause an electrical short circuit between cathode 11 and wall surface 13 onto which positive electrical voltage is applied in a similar manner as trigger electrode 12.

In plasma processing apparatus 1 in FIG. 2, starting end insulation ring 20, which is a starting end insulation plate, is equipped between plasma generating portion 10 and plasma advancing tube 30. This starting end insulation ring 20 electrically separates plasma advancing tube 30 from wall surface 13 of plasma generating portion 10 onto which positive electrical voltage is applied. By removing the electrical influence from plasma generating portion 10, electric field control and thus plasma stream control in plasma advancing tube 30 are made easier.

FIG. 3 is a conceptual diagram showing deposition of droplets 22 on an annular rib. As shown in (3A), while plasma stream 21 advances straightly, because droplets 22 are scattered, they are dispersed to the inner wall of plasma advancing tube 30. The scattered droplets 22 collide with annular rib 40, and after being reflected by said wall surface and annular rib 40, they are captured by annular rib 40. As shown in (3B), droplets 22 are easily captured at a location near said wall surface (so-called outside of annular rib 40).

Droplets 22 are captured on annular rib 40, forming droplet deposited matter 92. This droplet deposited matter 92 is extremely fragile, because the molecular force between droplets 22 is weak. Therefore, even if it falls from annular rib 40 and falls into plasma generating portion 10, because it is crushed by the impact force from the fall and enters into groove portion 14, it does not bridge and thus short-circuit cathode 11 and wall surface 13.

Annular rib in FIG. 3 is inclined downward toward inside. This downward inclination promotes a continuous reflection shown in (3A) of droplet 22 between said wall surface and annular rib 40. Droplet 22 is stopped by this continuous reflection, and is captured on annular rib 40. Therefore, the capture of droplets 22 becomes efficient. The inclination angle used commonly is 15-90°, with respect to the central axis of plasma advancing tube 30. The optimum inclination angle is 30-60°, based on experience.

Figure 4:
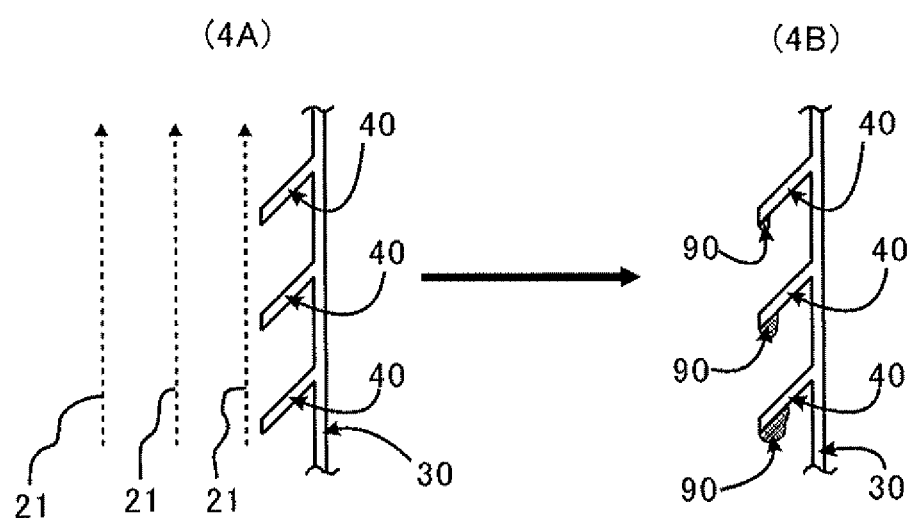
FIG. 4 is an outlined schematic diagram showing the deposition of plasma stream material on an annular rib.

FIG. 4 is an outlined schematic diagram showing the deposition of plasma stream material on an annular rib. As shown in (4A), because plasma stream 21 advances straightly inside plasma advancing tube 30, plasma stream 21 in the vicinity of the central axis of plasma advancing tube 30 does not come close to the wall surface of advancing tube 30. However, plasma stream 21 in the vicinity of said wall surface comes close to the inside of annular rib 40, and as shown in (4B), deposited matter 90 is formed by aggregation of the material in plasma stream 21 onto annular rib 40.

Because this deposited matter 90 is formed by an aggregation of the material in plasma stream 21 in a recrystallizing or near-recrystallizing state, its strength is high. Therefore, when it detaches and drops from annular rib 40, it can easily endure the impact force.

As shown in (4B), this deposited matter 90 is easily formed on the inside of annular rib 40. Therefore, it is shown that a size reduction of deposited matter 90 can be achieved by dividing only the inside of annular rib 40, and keeping the outside continuous without dividing. Annular rib 40 having such configuration is shown in FIG. 5.

Figure 5:
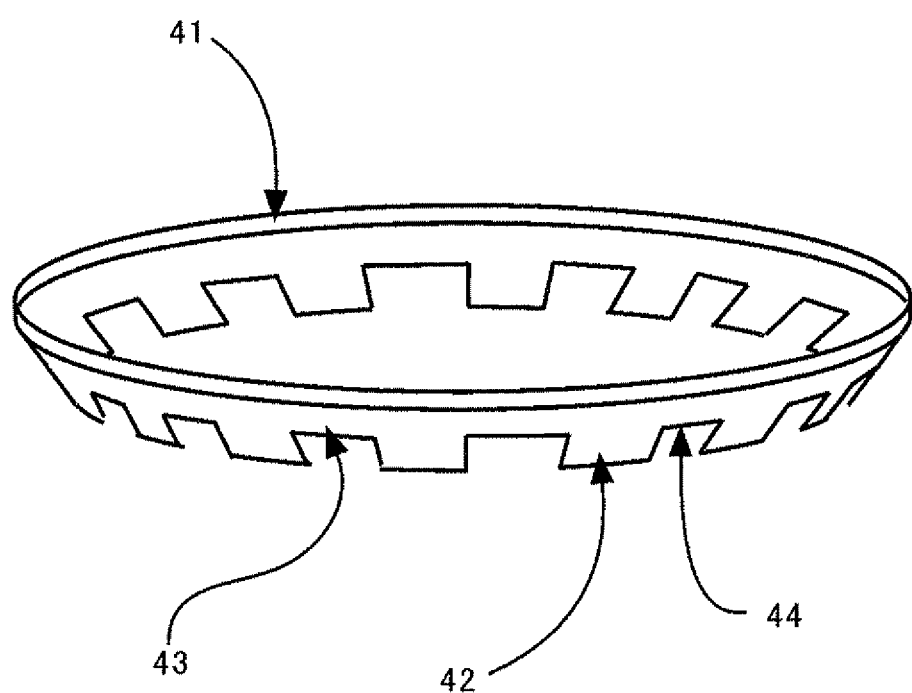
FIG. 5 is a perspective diagram of a multiply divided annular rib having partial indentations.

FIG. 5 is a perspective diagram of multiply divided annular rib 40 having partial indentations 44. When annular rib 40 is divided by these partial indentations 44, a continuous base end rib portion 43 is formed, while rib segments 42 are not completely separated from one another.

As described in the explanation for FIG. 4, the generation of deposited matter by plasma stream occurs more easily at the inside of annular rib 40. Therefore, rib segment 42 formed only at the inside can sufficiently decrease the size of the deposited matter. On the other hand, as described in the explanation for FIG. 3, deposition of droplets occurs easily at the outside of annular rib 40. Therefore, the capture of droplets can be made certain by making the base end rib portion non-divided. The width ratio between partial indentation 44 and annular rib 40 in annular rib 40 of FIG. 5 is preferably 10%-90%, and even more preferably, 25%-75%.

Figure 6:
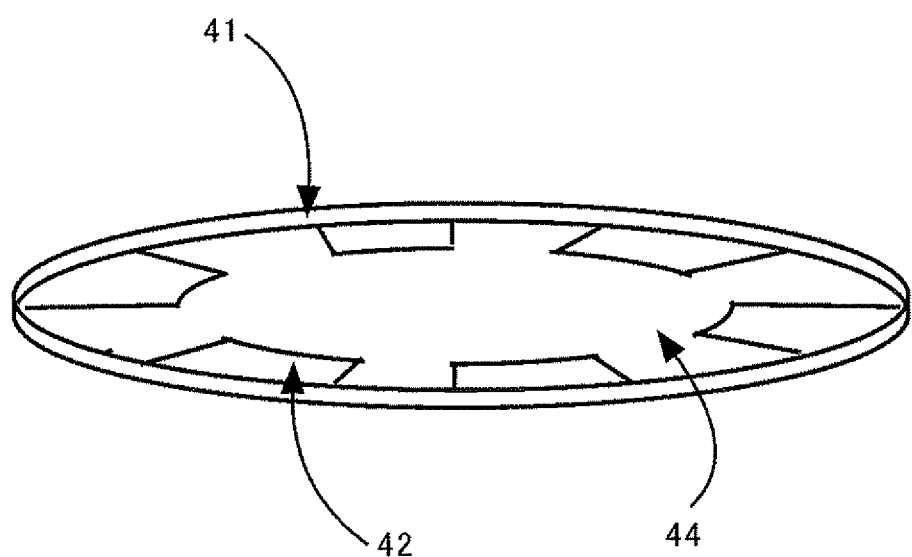
FIG. 6 is a perspective diagram of a multiply divided annular rib having rib segments placed horizontally.

FIG. 6 is a perspective diagram of multiply divided annular rib 40 having rib segments 42 placed horizontally. Annular ribs 40 in FIGS. 1 and 5 slant downward toward inside. On the other hand, annular rib 40 here is perpendicular with respect to the central axis, and parallel with respect to the ring plane of annular rib 40. When annular rib 40 is parallel with respect to said ring plane as thus described, the production becomes easier, and also the cleaning is facilitated, in comparison to cases in which annular rib 40 is inclined.

Rib segments 42 of annular rib 40 shown in FIG. 6 are completely divided mutually by indentations 44. However, rib segments 42 do not have to be completely separated from one another, but instead a base end rib portion resembling the one shown in FIG. 5 may be formed.

Figure 7:
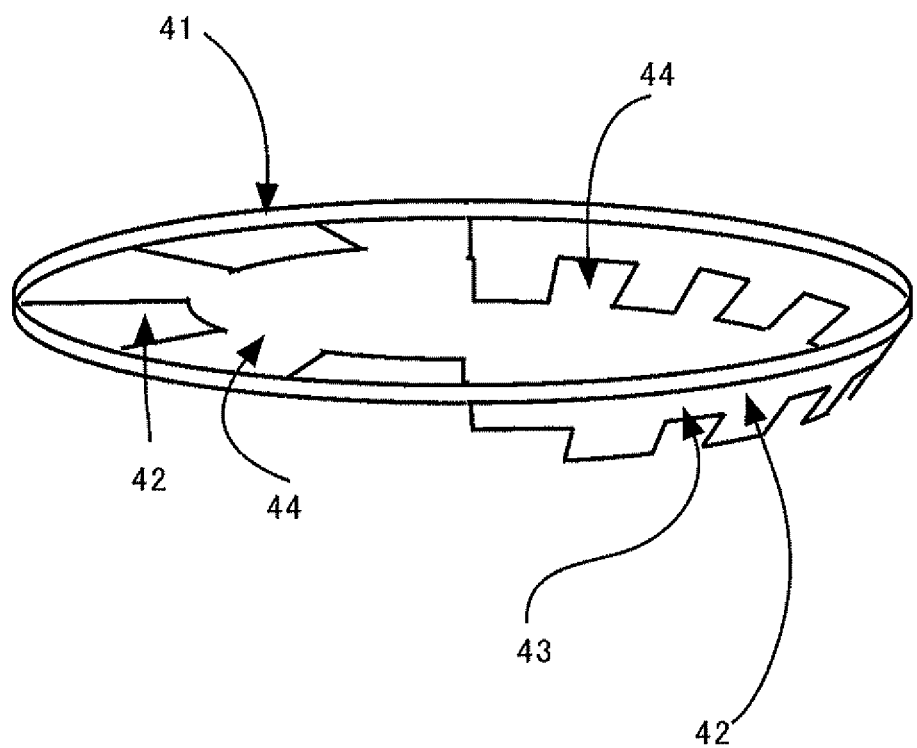
FIG. 7 is a perspective diagram of a multiply divided annular rib in which the area, configuration and angle values of the rib segments and the indentations are non-uniform.

FIG. 7 is a perspective diagram of multiply divided annular rib 40 in which the area, configuration and angle values of rib segments 42 and indentations 44 are non-uniform. In annular rib 40 here, inclined rib segments 42 and horizontal rib segments coexist on the ring plane of annular rib 40. Also, base end rib portion 43 is formed only at a part of the ring of annular rib portion 40. Furthermore, rib segments 42 with various area coexist. By such co-existing of multiple rib segments 42 whose configurations are different, it can deal with an uneven formation of deposited matter, whenever a plasma stream whose density and/or velocity is uneven is present in plasma advancing tube 30.

Figure 8:
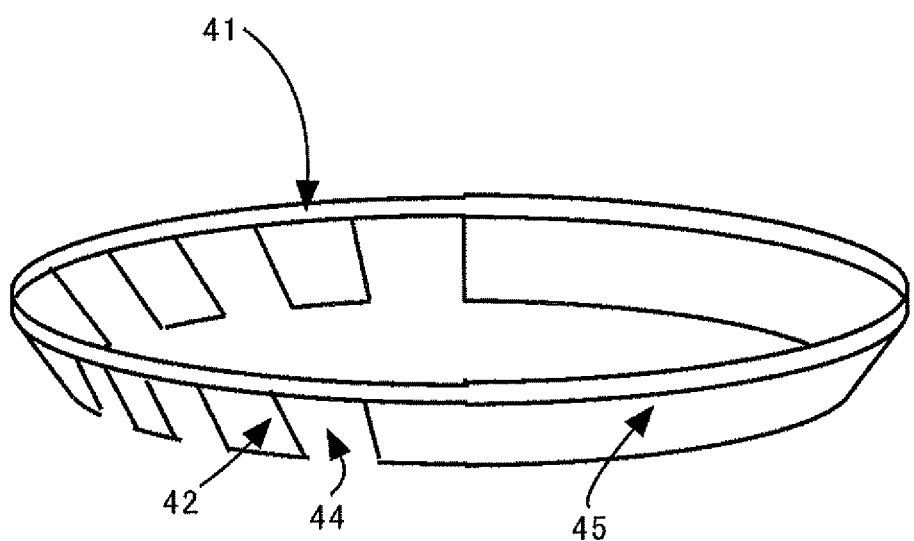
FIG. 8 is a perspective diagram of a multiply divided annular rib on which an undivided rib portion without indentations is partially formed.

FIG. 8 is a perspective diagram of multiply divided annular rib 40 on which undivided rib portion 45 without indentations 44 is partially formed. Here, undivided rib portion 45 can be considered as a rib segment whose area is relatively large. Therefore, multiply divided annular rib 40 here can be considered to be a variation of multiply divided annular rib 40 shown in FIG. 7, whose areas, configurations and inclination angle values are uneven. Similarly to multiply divided annular rib 40 of FIG. 7, by using annular rib 40 here, a formation of uneven deposited matter can be dealt with when a plasma stream whose density and/or velocity is uneven is present in plasma advancing tube 30.

Figure 9:
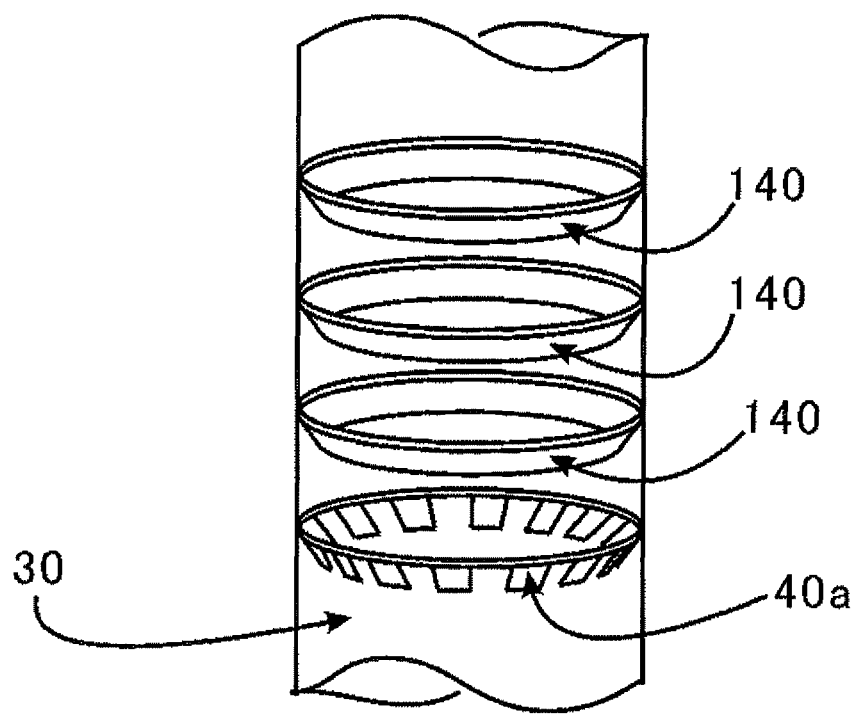
FIG. 9 is a transparent perspective diagram showing the state in which only a single first annular rib, a multiply divided annular rib, is placed in a plasma advancing tube.

FIG. 9 is a transparent perspective diagram showing the state in which only a single first annular rib 40a, a multiply divided annular rib, is placed in plasma advancing tube 30. As described in the explanation for FIG. 4, the deposited matter formation on an annular rib by re-aggregation of plasma stream tends to occur easily at the upstream of the plasma stream. Therefore, by making the annular rib placed most upstream to be a multiply divided annular rib of the present invention, the most effective placement configuration is obtained for size reduction of the deposited matter fragments.

Figure 10:
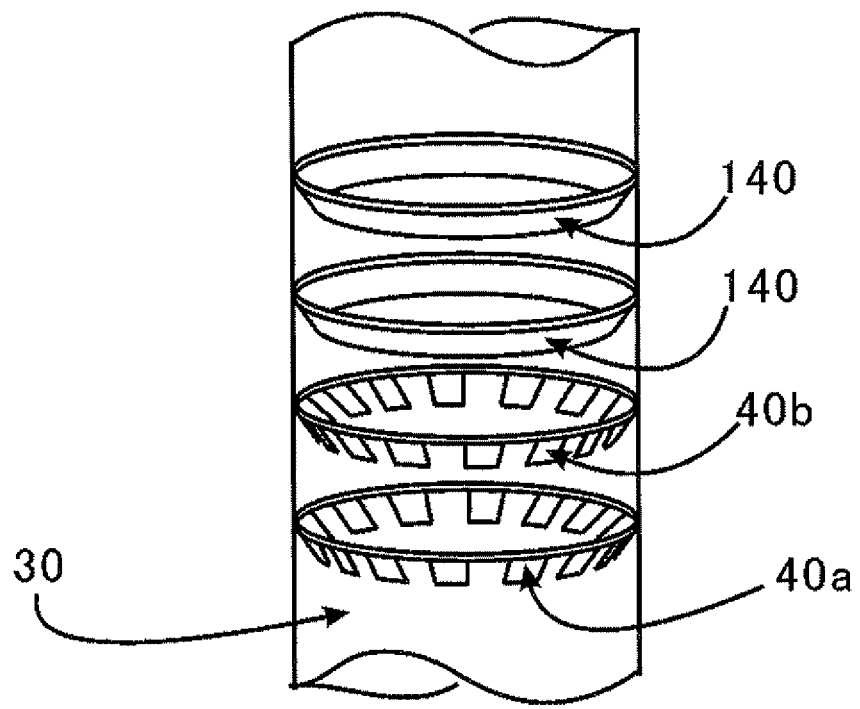
FIG. 10 is a transparent perspective diagram showing a state in which two multiply divided annular ribs are placed in a plasma advancing tube.

FIG. 10 is a transparent perspective diagram showing a state in which first annular rib 40a and second annular rib 40b, which are multiply divided annular ribs, are placed in a plasma advancing tube. Indentations 44 are formed in first annular rib 40a. The droplets pass through first annular rib 40a by passing through these indentations 44. Second annular rib 40b is positioned to capture these droplets. Rib segments 42 of second annular rib 40b are placed so as to cover indentations 44 of first annular rib 40a. Therefore, the droplets passing through indentations 44 of first annular rib 40a can be captured by rib segments 42 of second annular rib 40b.

In FIG. 10, the configuration of second annular rib 40b is same as first annular rib 40a. However, to reduce the passage of droplets, it is sufficient that all indentations 44 of first annular rib 40a are shielded by rib segments 42 of second annular rib 40b. Therefore, there is no need at all for the areas and configurations of rib segments 42 in second annular rib 40b to be same as the areas and configurations of rib segments 42 in first annular rib 40a.

Figure 11:
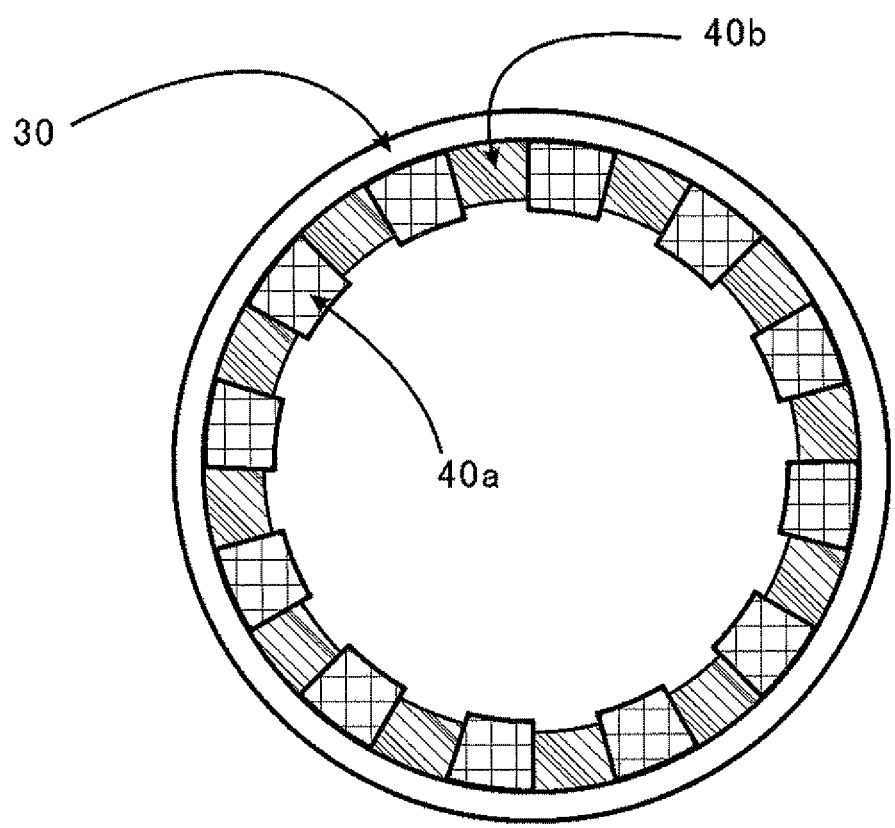
FIG. 11 is a transparent bottom view diagram showing a state in which two multiply divided annular ribs are placed in a plasma advancing tube so that each divided rib portion is shifted toward a rotating direction.

FIG. 11 is a transparent bottom view diagram showing a state in which rib segments 42 of each of first annular rib 40a and second annular rib 40b are shifted toward a rotating direction and placed in a plasma advancing tube. As such, rib segments 42 of second annular rib 40b are placed so as to cover indentations 44 of first annular rib 40a. By such arrangement, a size reduction of the deposited matter from aggregation of plasma material is achieved, and at the same time, a capture of droplets can be made certain.

Figure 12:
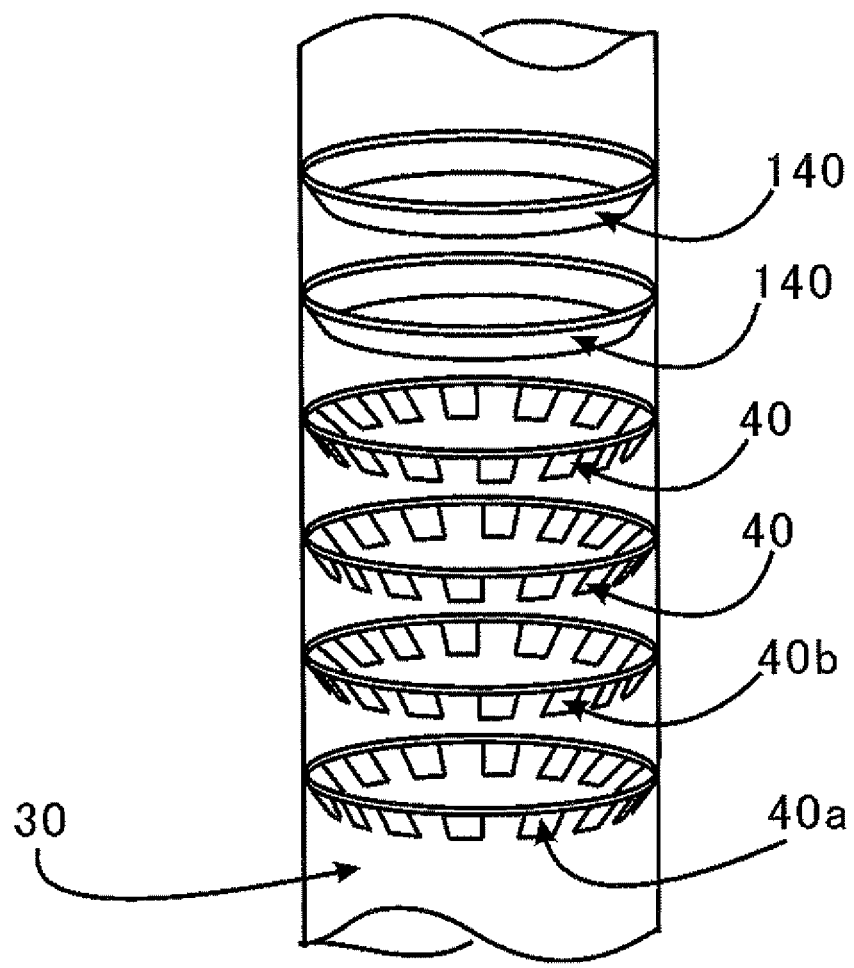
FIG. 12 is a transparent perspective diagram showing the state in which multiply divided annular ribs are placed at the downstream side of the first and the second annular ribs.

FIG. 12 is a transparent perspective diagram showing the state in which multiply divided annular ribs 40 are placed at the plasma stream downstream side of first annular rib 40a and second annular rib 40b. As such, by arranging multiply divided annular ribs 40 at the downstream side of first annular rib 40a and second annular rib 40b, a size reduction of deposited matter 90 from aggregation of plasma material can be achieved furthermore.

These annular ribs 40, first annular rib 40a, and second annular rib 40b do not need to have a same configuration. Also, it is not necessary that multiply divided annular ribs 40 be arranged in a proximity of second annular rib 40b, but instead they may be arranged at a location far from second annular rib 40b as long as they are at a site in which deposited matter from aggregation of plasma stream is easily formed.

Figure 13:
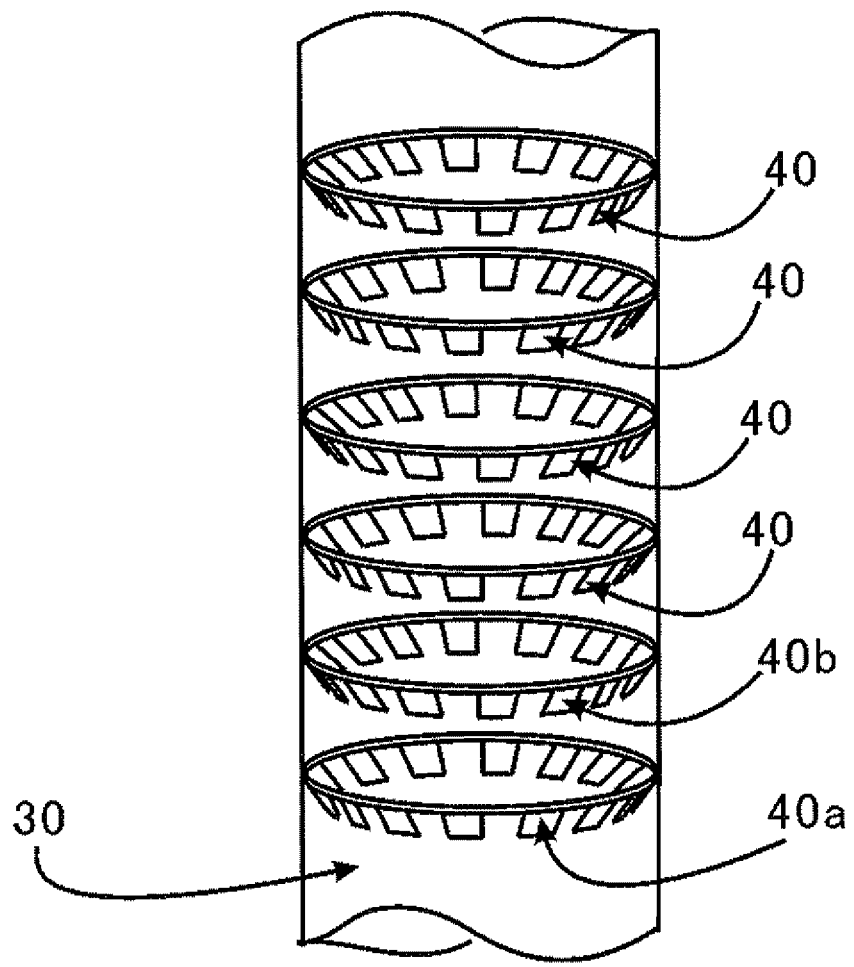
FIG. 13 is a transparent perspective diagram showing a state in which all the annular ribs in the plasma advancing tube are made to be multiply divided annular ribs.

FIG. 13 is a transparent perspective diagram showing a state in which all the annular ribs in plasma advancing tube 30 are made to be multiply divided annular ribs. By using multiply divided annular ribs for all the annular ribs in this way, a size reduction of deposited matter 90 can be made certain. In the same manner as the placement shown in FIG. 11, these multiply divided annular ribs 40, first annular rib 40a, and second annular rib 40b do not need to have a same configuration.

Figure 14:
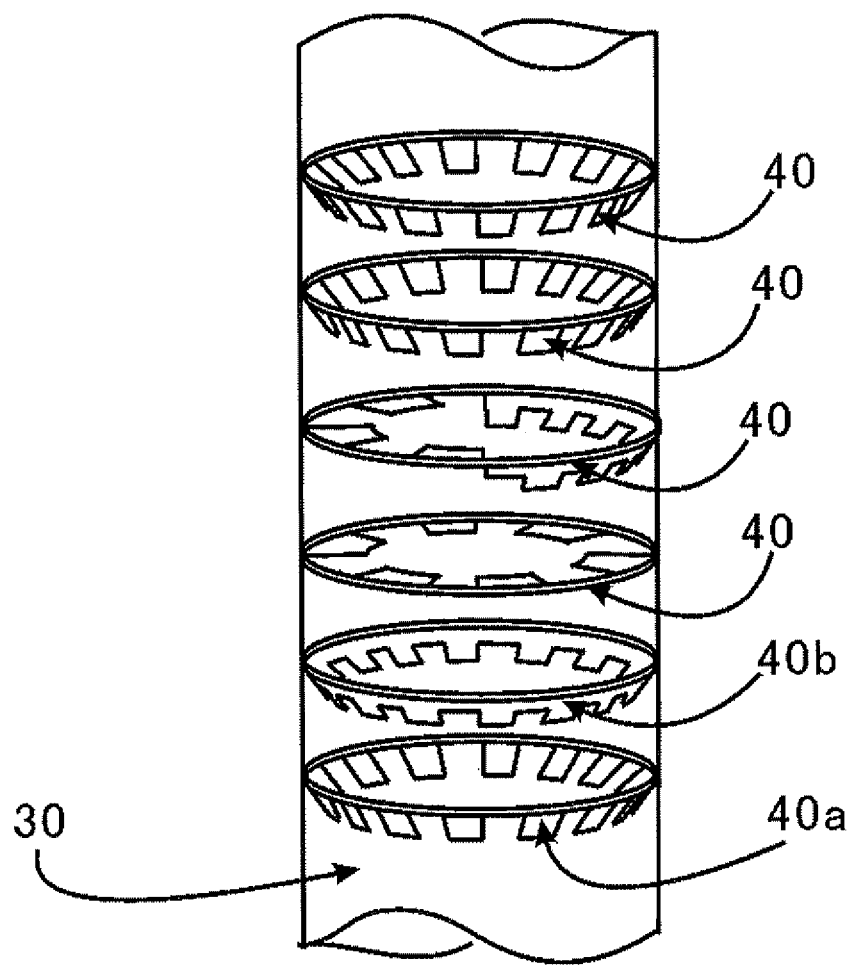
FIG. 14 is a transparent perspective diagram showing a state in which the multiple multiply divided annular ribs inside a plasma advancing tube are made into multiply divided annular ribs with different configurations.

FIG. 14 is a transparent perspective diagram showing a state in which the multiple multiply divided annular ribs inside plasma advancing tube 30 are made into multiply divided annular ribs with different configurations. By such coexisting of multiply divided annular ribs whose configurations differ from one another, an uneven formation of deposited matter can be handled when a plasma stream whose density and/or velocity is uneven exists inside plasma advancing tube 30.

Figure 15:
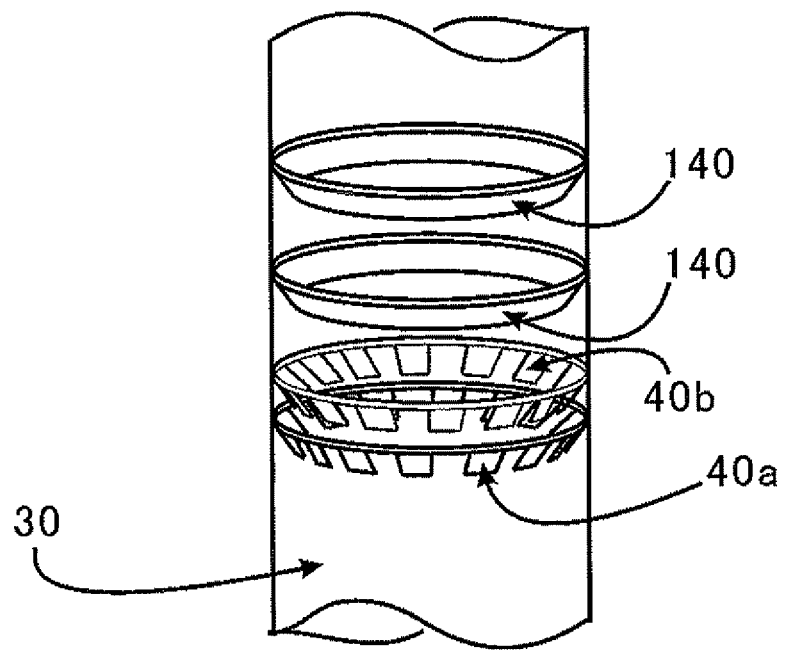
FIG. 15 is a transparent perspective diagram showing the state in which the spacing between first annular rib and second annular rib has been narrowed.

FIG. 15 is a transparent perspective diagram showing a state in which the spacing between first annular rib 40a and second annular rib 40b has been narrowed. Because droplets 22 are solid material, their density is high compared to plasma, and therefore the pathway of droplets 22 becomes curved by influences of gravity and others. Because of this, there is a possibility that the droplets pass though indentations 44 of first annular rib 40a and of second annular rib 40b. By narrowing the spacing between first annular rib 40a and second annular rib 40b as in here, the possibility of droplets passing through two multiply divided annular rib can be reduced.

Also, the spacing between first annular rib 40a and second annular rib 40b may be widened. In such case, the placement procedure of these annular ribs into plasma processing apparatus 1 becomes easier.

Figure 16:
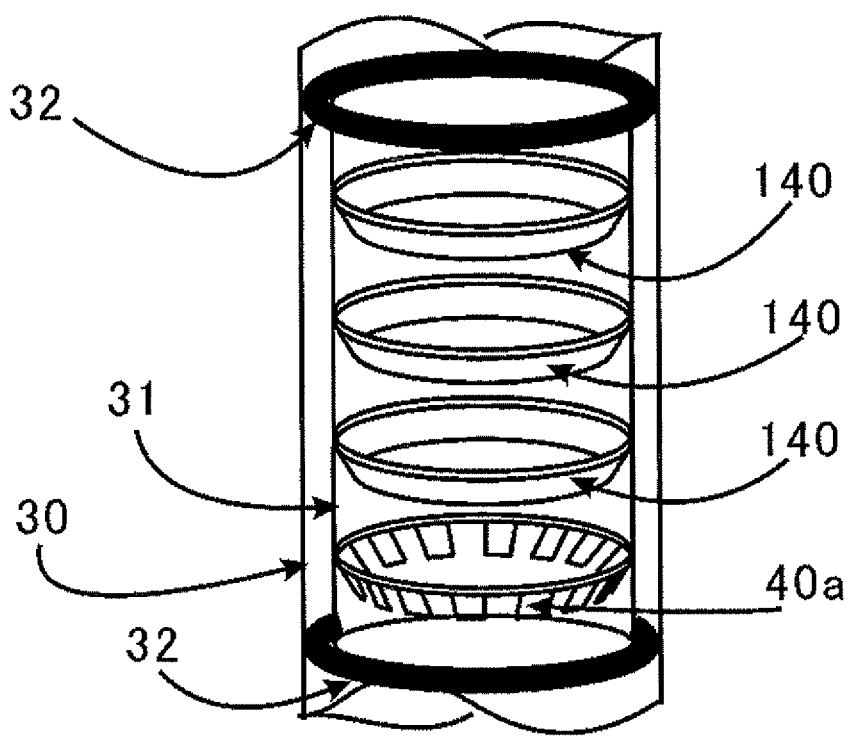
FIG. 16 is a transparent perspective diagram showing a state in which an inner circumferential tube is placed inside a plasma advancing tube, and a multiply divided annular rib is placed as the first annular rib inside said inner circumferential tube.

FIG. 16 is a transparent perspective diagram showing a state in which inner circumferential tube 31 is placed inside plasma advancing tube 30, and multiply divided annular rib 40 is placed as first annular rib 40a inside inner circumferential tube 31. It is necessary that plasma advancing tube 30 is capable of enduring the stress due to the pressure difference between the exterior and the interior of plasma processing apparatus 1. By processing this plasma advancing tube 30, for example the placing of multiply divided annular ribs among others, the strength and hermeticity of plasma advancing tube 30 could be weakened. As such, by positioning multiply divided annular ribs in inner circumferential tube 31 beforehand, and positioning inner circumferential tube 31 in plasma advancing tube 30 afterward, the process becomes simplified, and also the strength and hermeticity of plasma advancing tube 30 can be reliably obtained.

In FIG. 16, only first annular rib 40a is placed as multiply divided annular rib. However, needless to say, multiply divided annular ribs may also be arranged as in FIGS. 10-15.

Also, in FIG. 16, insulation portion 32 is installed between inner circumferential tube 31 and plasma advancing tube 30. This insulation portion 32 does not need to be installed in the present invention, and if it is not, the production of plasma processing apparatus 1 becomes easier. However, when insulation portion 32 is placed, it becomes advantageous in that, because it can make inner circumferential tube 31 electrically independent from plasma generating portion 10 and others, the control of the electric field inside inner circumferential tube 30 becomes easier.

Figure 17:
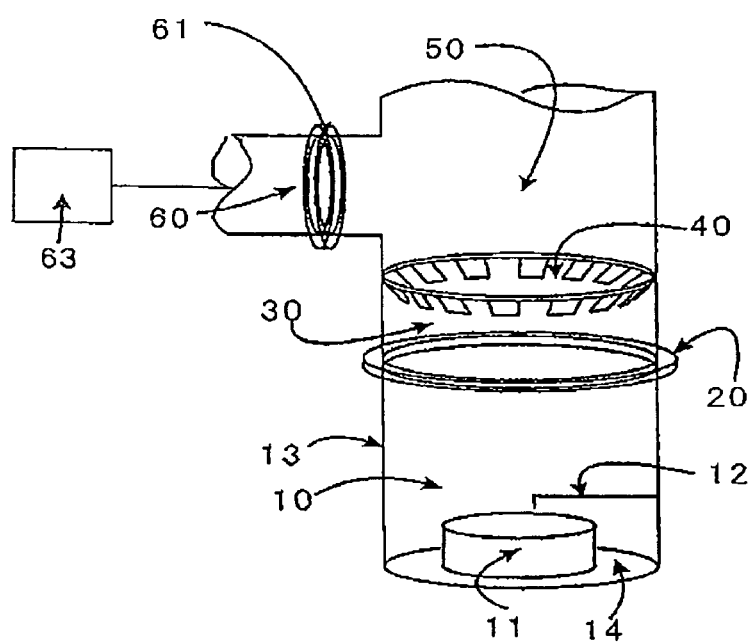
FIG. 17 is a transparent perspective diagram showing a plasma processing apparatus in which a finishing end section insulation plate has been placed in a horizontal plasma advancing tube.

FIG. 17 is a transparent perspective diagram showing plasma processing apparatus 1 in which finishing end section insulation plate 61 has been placed in horizontal plasma advancing tube 60. In FIG. 17, starting end insulation ring 20 that is a starting end portion insulation plate and finishing end section insulation plate 61 are set up, but even in a state in which starting end insulation ring 20 is omitted, one can remove an electric influence of plasma generating portion 10 to the plasma processing portion 63 set up at the end portion of the horizontal plasma advancing tube, leading to a quality improvement of the thin film on the object to be treated. As shown in FIG. 17, by installing two insulation plates 20, 61, plasma advancing tube 30 can be made completely independent electrically from the other parts of plasma processing apparatus 1. Therefore, it becomes possible to set freely the electric field in plasma advancing tube 30, and the degree of freedom of the plasma stream control is increased.

Figure 18:
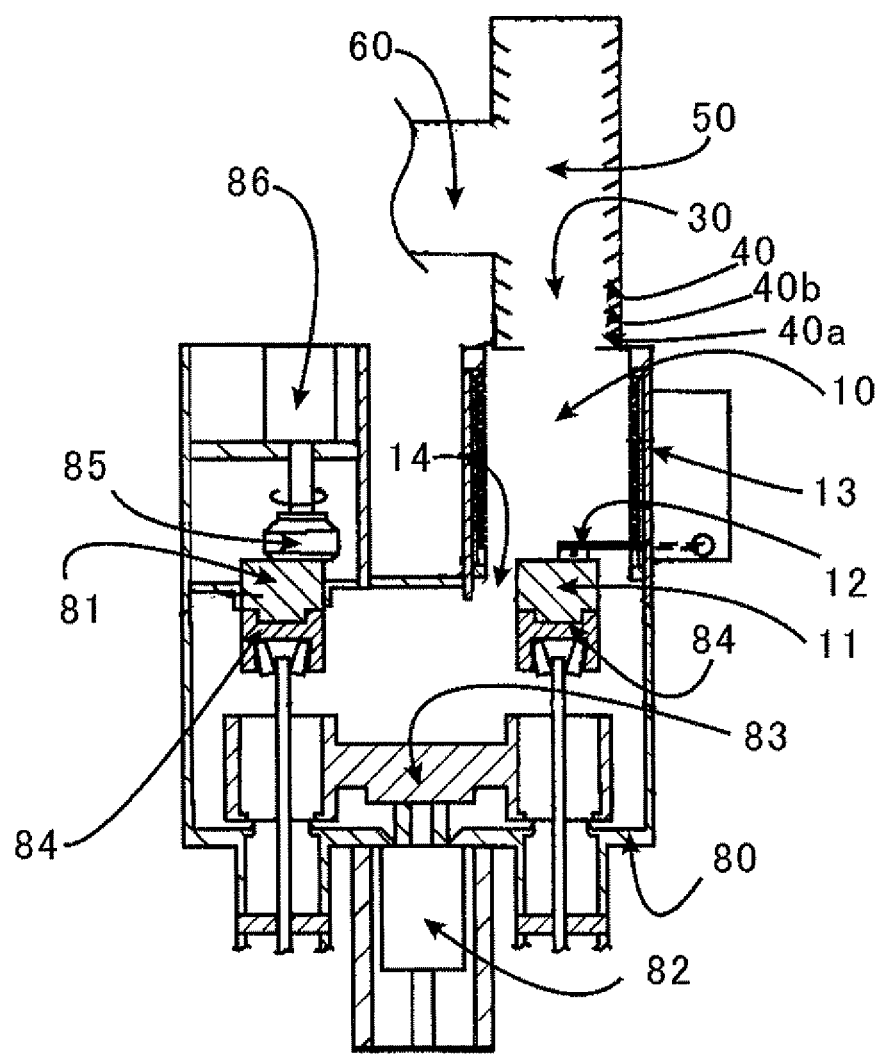
FIG. 18 is a front perspective diagram of a plasma processing apparatus in which a cathode exchange portion 80 has been set up.
Figure 19:
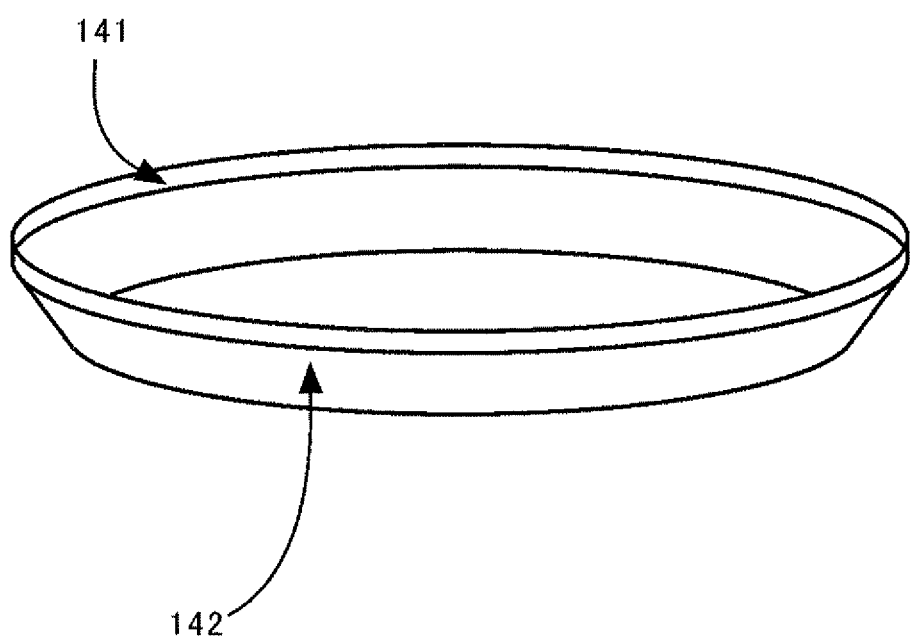
FIG. 19 is a perspective diagram of a conventional annular rib.
Figure 20:
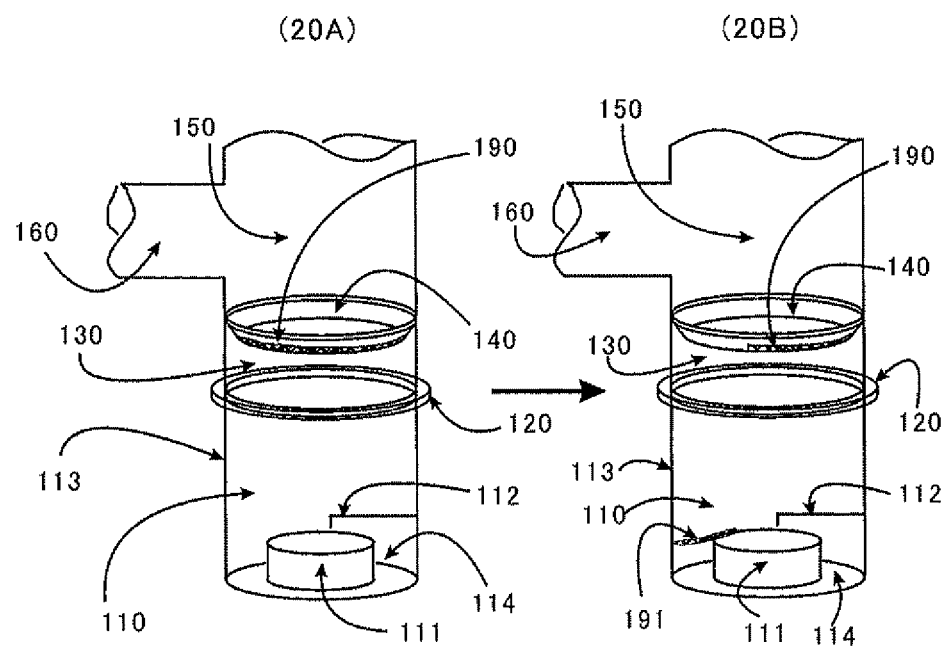
FIG. 20 is a transparent schematic diagram showing a causation of short circuit by a deposited matter fragment in a conventional plasma processing apparatus.

FIG. 18 is a front perspective diagram of plasma processing apparatus 1 in which cathode exchange portion 80 had been set up. Cathode exchange portion 80 here comprises cathode for exchange 81, motor 82, cathode exchange platform 83, two cathode raising and lowering platforms 84, grinder 85, and motor for grinder 86 for driving said grinder. Cathode for exchange 81 is placed at the standby position isolated from the electric discharge position, and its surface is polished by grinder 85 that is the cathode polishing portion. Cathode 11 and cathode for exchange 81 respectively are set up on cathode raising and lowering platform 84. To exchange cathode for exchange 81 and electric discharge cathode 11 placed at the discharging position, the two cathode raising and lowering platforms 84 are lowered, cathode exchange platform 83 is rotated 180° by motor 82, and the two cathode raising and lowering platforms 84 are raised. By this cathode exchange portion 80, cathode 11 whose surface has been consumed by use can be exchanged with cathode for exchange 81 whose surface has been polished, while the vacuum is maintained inside plasma processing apparatus 1.

Cathode exchange portion 80 is easily damaged by a short circuit between cathode 11 and wall surface 14 of plasma generating portion 10. However, by reducing the size deposited matter 90 by first annular rib 40a, second annular rib 40b, and other multiply divided annular ribs 40 so that fragment 91 of the deposited matter can enter into groove portion 14, said short circuit can be prevented.

INDUSTRIAL APPLICABILITY

By the divided annular rib type plasma processing apparatus of the present invention, a size reduction of deposited matter can be achieved by aggregation of plasma stream material in an annular rib that is a droplets removal means. Because of this, a short circuit in the plasma generating portion by said deposited matter can be prevented. By this prevention of short circuit, a life extension and an improvement in the reliability of the plasma processing apparatus can be achieved, and also, a stabilization of treatment processing by stabilization of plasma stream and improvement of the standard can be achieved. Because of this, a quality improvement and price reduction can be achieved for treated objects that have been film-coated.

The invention claimed is:

1. In a plasma processing apparatus transporting a plasma generated in a plasma generating portion by an electric discharge between a trigger electrode and a cathode to a plasma processing portion through a plasma advancing tube in which multiple annular ribs for droplet capture are arranged on an inside surface, a divided annular rib type plasma processing apparatus, characterized in that a first annular rib exposed to said plasma that is the furthest advanced among said annular ribs is comprised of at least a multiply divided annular rib divided into multiple rib segments by interposing multiple indentations, wherein said divided annular rib type plasma processing apparatus is comprised of said cathode arranged at an electric discharge position of said plasma generating portion, a cathode for exchange placed at a standby position separated from said electric discharge position, a cathode polishing portion that polishes a surface of said cathode for exchange, and a cathode exchange portion that exchanges said cathode with said cathode for exchange.

2. The divided annular rib type plasma processing apparatus of claim 1, wherein a second annular rib that is positioned at a further downstream side of said plasma stream than first annular rib in a neighboring fashion is comprised of said multiply divided annular ribs, and said second annular rib is positioned to shield all said indentations of said first annular rib by rib segments of said second annular rib.

3. The divided annular rib type plasma processing apparatus of claim 2, wherein among multiple annular ribs that are placed at a further downstream side of said plasma stream than said second annular rib, a single or multiple annular ribs are comprised of said multiply divided annular rib.

4. The divided annular rib type plasma processing apparatus of claim 2, wherein all annular ribs placed at a plasma stream downstream side of said second annular rib are comprised of said multiply divided annular ribs.

5. The divided annular rib type plasma processing apparatus of claim 2, wherein at least two of said multiply divided annular ribs have different configurations.

6. The divided annular rib type plasma processing apparatus of claim 1, wherein said indentations are formed so that they span the full width of said multiply divided annular rib.

7. The divided annular rib type plasma processing apparatus of claim 1, wherein said indentations are formed so that they span a partial width of said multiply divided annular rib from the inside of said multiply divided annular rib.

8. The divided annular rib type plasma processing apparatus of claim 1, wherein said multiply divided annular rib inclines downward from outside to inside.

9. The divided annular rib type plasma processing apparatus of claim 1, wherein said multiply divided annular rib is perpendicular to a central axis of said plasma advancing tube.

10. The divided annular rib type plasma processing apparatus of claim 1, wherein areas, shapes, and/or angles of inclination of said rib segments and/or said indentations in said multiply divided annular rib are nonuniform.

11. The divided annular rib type plasma processing apparatus of claim 1, wherein an inner circumferential tube is placed inside said plasma advancing tube, and said multiply divided annular rib portion is placed inside said inner circumferential tube.

12. The divided annular rib type plasma processing apparatus of claim 11, wherein an insulation portion is interposed between said plasma advancing tube and said inner circumferential tube, while said plasma advancing tube and said inner circumferential tube are made to be mutually independent electrically.

13. The divided annular rib type plasma processing apparatus of claim 1, wherein a starting end insulation ring is interposed between said plasma generating portion and said plasma advancing tube, while said plasma generating portion and said plasma advancing tube are made to be mutually independent electrically.

14. The divided annular rib type plasma processing apparatus of claim 1, wherein said plasma processing portion that processes an object to be treated by a plasma supplied from said plasma advancing tube and said plasma advancing tube are made to be mutually independent electrically, by interposing a finishing end insulation plate between said plasma processing portion and said plasma advancing tube.

* * * * *